United States Patent [19]
Lamanna et al.

[11] Patent Number: 4,892,798
[45] Date of Patent: Jan. 9, 1990

[54] ELECTROPHORETIC IMAGING METAL-TONER FLUID DISPERSION

[75] Inventors: William M. Lamanna; Robin E. Wright; Hsin-Hsin Chou, all of St. Paul, Minn.

[73] Assignee: Minnesota Mining and Manufacturing Company, St. Paul, Minn.

[21] Appl. No.: 283,596

[22] Filed: Dec. 13, 1988

[51] Int. Cl.$^4$ ............................................. G03G 13/10
[52] U.S. Cl. ....................................... 430/38; 430/119
[58] Field of Search .................... 430/38, 37, 117, 119

[56] References Cited

U.S. PATENT DOCUMENTS

| | | | |
|---|---|---|---|
| 4,245,026 | 1/1981 | Ziolo | 430/137 |
| 4,252,671 | 2/1981 | Smith | 252/430 |
| 4,252,672 | 2/1981 | Smith | 252/430 |
| 4,252,675 | 2/1981 | Smith | 252/430 |
| 4,272,596 | 6/1981 | Harbour et al. | 430/38 |
| 4,576,725 | 3/1986 | Miura et al. | 252/62.51 |
| 4,599,184 | 7/1986 | Nakatani et al. | 252/62.51 |

OTHER PUBLICATIONS

Schaffert, R. M., "Electrophotography", The Focal Press, New York, pp. 562-574, (1975).
Turkevich, J., J. Gold Bull. 18, 86-91 and 125-131 (1985).
Hirai, H., et al., J. Macromol. Sci.-Chem. A13, 663-649 and 727-750 (1979).
Klabunde, K., et al., Proc. SPIE-Int. Soc. Opt. Eng. 821, 206-213 (1988).
Klabunde, K., et al., Langmuir 2, 259-260 (1986).
Klabunde, K., et al. ACS Symposium Series, 333 (High Energy Processes Organomet. Chem.) 246-259 (1987).
Klabunde, K. et al., Langmuir 3, 986-992 (1987).
Kimura, et al., Bull Chem. Soc. Jpn. 56, 3578-3584 (1983); 57, 1683-1684 (1984).
Ozin and Andrews, J. Phys. Chem., 90, 2929-2938 (1986).
U.S. Patent Application Ser. No. 07/125,600.
Buske, N., Colloids and Surfaces 12, 195-202 (1984).
Shimoiizaka, J., et al., Fine Part. Process., Proc. Int. Symp., Samasundaran, P.Ed., AIME: New York 1980, pp. 1310-1324.
Papirer, E., et al., J. Colloid and Interface Sci. 1983, 94, 207-219 and 220-228.
Kilner, M., et al., IEEE Transactions on Magnetics 1984, 20, 1735-1737.
Hoon, S. R., et al., J. Magn. Magn. Mater. 1983, 39, 107-110.
Nakatani, I., et al., J. Magn. Magn. Mater. 65, 261-264 (1987).

Primary Examiner—John L. Goodrow
Attorney, Agent, or Firm—Donald M. Sell; Walter N. Kirn; Lorraine R. Sherman

[57] ABSTRACT

The present invention relates to toner fluid dispersions comprising electrostatically charged colloidal elemental metal particles dispersed in nonconductive organic liquid media of low dielectric constant and containing a charge-inducing surfactant. In other aspects, processes are disclosed for electrophoretically depositing the colloidal elemental metal particles of the toner fluid to produce nonconductive, continuous coatings or patterns and methods of enhancing the coatings or patterns to make them electrically conductive.

23 Claims, No Drawings

ELECTROPHORETIC IMAGING METAL-TONER FLUID DISPERSION

BACKGROUND OF THE INVENTION

1. Field of the Invention

The present invention relates to a toner fluid composition. In another aspect, there is disclosed a process for electrophoretically depositing the particles of the toner fluid to provide coatings or patterns on a substrate. In a further aspect, a method is provided for enhancing the coatings or patterns to make them electrically conductive.

2. Description of the Background Art

Liquid developers or toners are commonly used in electrophoretic development, particularly for applications where high image resolution is desired. Toner fluids are typically comprised of finely ground pigment particles dispersed in an insulating, organic carrier liquid with charge control agents and/or surfactants added to impart electrostatic charge to the particles and provide steric stabilization toward flocculation. When an exposed electrographic film bearing a latent, electrostatic charge image of a polarity opposite to that of the dispersed pigment particles contacts the toner fluid, the particles migrate to and deposit upon the image, a process known as electrophoretic development.

Latent charge images can be formed using a variety of electrographic processes including: (1) light or X-ray exposure of an electrostatically charged photoconductor, (2) electrical discharge resulting from application of a high voltage between stylus and a conductive support covered with a dielectric receptor, (3) ion projection, (4) electron beam printing, or (5) corona discharge through a metallic mask, etc.

Liquid developers or toners must satisfy a number of requirements; in particular, the concentration of excess ions must be very low in order to prevent competition between the charged toner particles and ions of the same polarity for development of the latent electrostatic image. Volume resistivities greater than $10^{12}$ ohm.cm for the pure carrier liquid are normally required; hydrocarbon and halogen-substituted hydrocarbon liquids are commonly employed. Other factors, such as low dielectric constant (less than 3.5), low viscosity and convenient melting point and boiling point of the medium, colloidal particles with high charge-to-mass ratios and mobilities, small particle size, adhesion of the colloidal particles to the substrate, and stability toward flocculation are also important. Typical particle compositions include pigments such as phthalocyanine blue, monolite red R.S., nigrosene, zinc oxide, and carbon black as well as a number of colored resin composites (i.e. latexes). For a more detailed description of liquid toners and the liquid electrophoretic development process, see R. M. Schaffert, "Electrophotography", The Focal Press, New York, pages 562-574 (1974).

Chemical methods of producing colloidal metal dispersions via metal salt reduction are well established, but entail use of aqueous or polar organic media (high conductivity and dielectric constant). In addition, reductive methods neccesarily produce ionic byproducts which further increase the conductivity of the liquid medium. A recent review dealing with the history, preparation, structural features and properties of aqueous colloidal gold dispersions is given by J. Turkevich in J. Gold Bull. 18, 86-91 and 125-131 (1985). Reductive methods of preparing colloidal metal dispersions in alcohol or alcohol/water mixtures are described by H. Hirai, et. al. in J. Macromol. Sci.-Chem. A13, 633-649 and 727-750 (1979).

Metal evaporation techniques for the production of stable colloidal metal dispersions in polar organic liquids without added surfactants have been described by Klabunde, K. et al. in Proc. SPIE-Int. Soc. Opt. Eng. 821, 206-213 (1988); Klabunde, K. et al., Langmuir 2, 259-260 (1986); Klabunde, K. et al. ACS Symposium Series, 333 (High Energy Processes Organomet. Chem.) 246-59 (1987); Klabunde, K. et al., Langmuir 3, 986-992 (1987); and by Kimura et. al. in Bull. Chem. Soc. Jpn. 56, 3578-3584 (1983) and 57, 1683-1684 (1984). Electrophoretic mobility studies have established that dispersed metal particles in these polar media are electrostatically charged. Although the charging mechanism is uncertain, the electrostatic repulsion between particles is thought to play an important role in stabilizing the dispersions. Unlike dispersions prepared by reductive methods, the evaporative techniques produce no ionic byproducts. However, conductivities and dielectric constants of polar organic liquids are outside the useful range for toner fluids. Similarly prepared dispersions in nonpolar hydrocarbon media undergo rapid flocculation and settling.

Ozin and Andrews in J. Phys. Chem., 90, 2929-2938 (1986) disclose colloidal silver dispersions formed in liquid polyolefins such as poly(butadiene), poly(isoprene) and squalene using metal evaporation techniques.

Magnetic ferrofluids consisting of surfactant-stabilized dispersions of colloidal, ferromagnetic metal or metal oxide particles have been prepared in aqueous media as well as in polar and nonpolar organic liquids. A variety of methods, including prolonged grinding, precipitation, thermal or photochemical decomposition of metal carbonyls and metal evaporation techniques have been used in the preparation of these magnetic dispersions. [See N. Buske, et al. Colloids and Surfaces 12, 195-202 (1984); J. Shimoiizaka, et al. Fine Part. Process., Proc. Int. Symp., Somasundaran, P. Ed., AIME: New York 1980, pp. 1310-1394; E. Papirer, et al. J. Colloid and Interface Sci. 1983, 94, 207-219 and 220-228; M. Kilner, et al. IEEE Transactions on Magnetics 1984, 20, 1735-1737; S. R. Hoon, et al. J. Magn. Magn. Mater. 1983, 39, 107-110; U.S. Pat. No. 4,576,725; U.S. Pat. No. 4,599,184; I. Nakatani, et al. J. Magn. Magn. Mater. 65, 261-264 (1987)].

Magnetic developers for xerography have been patented (U.S. Pat. Nos. 4,252,671 and 4,252,672) which consist of colloidal elemental iron particles dispersed in organic liquid media and stabilized by an active or passive polymer which is bound to the particle surface. Use of these materials as developers is based, as in the case of ferrofluids, on the magnetic properties of the dispersed iron particles and their mobility in a magnetic field. A patent covering dispersions of chromium, molybdenum, and tungsten useful for the preparation of supported catalysts or optical recording media is U.S. Pat. No. 4,252,675. In yet another disclosure, U.S. Pat. No. 4,245,026 describes magnetically responsive toner particles comprised of a low density, imbibitive polymer particle impregnated within the pores of the polymer with iron, cobalt, nickel or their respective oxides.

SUMMARY OF THE INVENTION

Briefly, the present invention provides a toner fluid comprising electrostatically charged, colloidal elemental metal particles dispersed in an electrically nonconductive organic carrier liquid of low dielectric constant and a soluble surfactant in sufficient concentration to charge and stabilize the colloidal metal dispersion. Preferably, the colloidal metal particles are nonferromagnetic, and more preferably they are noble metal particles.

In another aspect, this invention relates to a process for electrophoretically depositing the colloidal metal particles of the toner fluid on a dielectric or photoconductive substrate to produce nonconductive, metallic coatings on the substrate surface in the form of continuous or discontinuous films which may be patterned images.

In a still further aspect, in the case of a catalytically active colloidal metal, the present invention relates to a process whereby the colloidal metal coated substrate, wherein the metal coating is continuous or discontinuous, is subjected to an electroless plating solution to induce selective, catalyzed, metal plating in the colloid coated areas to provide a second metal coating which is electrically conductive, thus imparting electrical conductivity to those areas.

More particularly, this invention provides a process comprising the steps:

(a) providing the toner fluid of the invention, and providing a dielectric or photoconductive substrate, (b) electrophoretically depositing the charged, colloidal elemental metal particles of the toner fluid in a uniform or imagewise fashion on at least a portion of at least one surface of the substrate using standard electrographic techniques to provide an electrically nonconductive, colloidal, elemental metal coating thereon, and (c) optionally, in the case of a catalytically active colloidal metal, subjecting the resulting colloidal elemental metal coated substrate to an electroless metal plating solution to induce selective metal plating on the colloidal elemental metal coated portions of the substrate surface, to provide a second elemental, metal coating on said portions of the substrate surface which is electrically conductive.

Toner fluid compositions of this invention represent a departure from the background art in that the dispersed phase consists of elemental metal particles in the colloidal size range. Unlike the traditional pigment particles used in toner fluids solely for graphics applications, colloidal elemental metal particles offer unique catalytic, electrical, magnetic, optical and biological properties which form the basis for novel application concepts for coated substrates in a host of different areas.

Stable dispersions of electrostatically charged, colloidal elemental metal particles in liquid media of suitably low conductivity and dielectric constant have not previously been available for use as liquid toners in electrophoretic coating or imaging. This is principally due to the lack of effective methods of preparing stable dispersions of the required composition.

In this application:

"electrophoretic" means relating to the migration of suspended particles in an electric field;

"toner fluid" or "liquid developer" or "liquid toner" means a dispersion of small, charged particles in a fluid medium, which respond to an electrostatic field in such a way as to make them useful in electrophoretic coating and imaging;

"dispersion" means a two phase system where one phase consists of small solid particles (i.e. in the colloidal size range, 1–100 nm) preferably 2 to 50 nm distributed throughout and suspended in a continuous, bulk, liquid phase;

"metal" means Periodic Table main group metals, transition metals, noble metals, rare earth metals, and metalloids;

"stable" means that no more than 10 percent of the particles in the colloidal dispersions settle over a period of 1 week under ambient conditions of 25° C. and 1 atmosphere pressure (760 Torr);

"electrically nonconductive", when it refers to the organic carrier liquid, means that the pure liquid has a volume resistivity greater than $10^{12}$ ohm.cm;

"electrically conductive", when it refers to the metallic coatings, means that the conductivity of the coatings is greater than $10^4$ $(ohm.cm)^{-1}$;

"electrically nonconductive", when it refers to the metallic coatings, means that the conductivity of the coatings is at most $10^3$ $(ohm.cm)^{-1}$;

"low dielectric constant" means a value less than 3.5 and preferably less than 2.5 at 25° C. and 1 kHz;

"surfactant" means a surface active agent or dispersing agent or charge control agent which interacts with the surface of the dispersed particles to provide electrostatic charge and in some cases steric stabilization;

"substrate" means a material upon which a metallic coating is deposited or image is developed;

"image" or "patterned image" means a reproduction or representative reproduction of some original pattern of lines and/or shapes;

"liquid medium" or "carrier liquid" means an organic liquid used to disperse the colloidal metal particles of the invention;

"soluble surfactant" means at least 1 milligram of surfactant dissolves in 100 ml of the chosen organic carrier liquid; and "without appreciable flocculation" means the number average particle size as measured by photon correlation spectroscopy increased by at most a factor of 10, preferably a factor of 5, and most preferably a factor of 2, over a period of 3 months at a temperature of 25° C. and 1 atmosphere pressure.

Ferrofluids are known in the art. Their physical behavior and applications derive from the ferromagnetic properties of the dispersed particles and the extraordinary stability of the dispersions in a magnetic field enables the entire fluid to flow or become immobilized by an external magnetic field without irreversible flocculation. In contrast, physical behavior and utility of toner fluids relies on the electrostatic charge of the dispersed particles and their tendency to migrate and irreversibly flocculate in an external electric field, which, in turn, is strongly dependent on factors such as conductivity and dielectric constant of the medium. Despite certain similarities in composition, ferrofluid and toner fluid performance are expected to be mutually exclusive and dependent on the interplay of various factors including surfactant and particle composition, surfactant and particle loading, and the composition and physical properties of the medium.

DETAILED DESCRIPTION AND SPECIFICATION OF THE INVENTION

The present invention provides unique toner fluid compositions useful for the electrophoretic production of metallic coatings and images. Toner fluids are comprised of electrostatically charged, essentially pure, elemental, colloidal metal particles dispersed in a non-conductive, organic carrier liquid of low dielectric constant and a soluble surfactant in sufficient concentration to charge and stabilize the colloidal metal dispersion. Generally the metallic toner particles are negatively charged, but in certain instances they are positively charged. Volume resistivity of the final toner fluid dispersion is preferably greater than $10^9$ and more preferably greater than $10^{10}$ ohm.cm.

For preparing the colloidal metal dispersions of the present invention, known apparatus may be employed for generating metal vapors which can be atomic metal vapors or a gaseous stream of colloidal metal particles and contacting them with a dilute solution of the surfactant in an organic carrier liquid. Specifically, the gas evaporation reactor (GER) as described in U.S. patent application Ser. No. 07/125,600 has proven to be particularly useful for this purpose. Other reactor designs, such as the Klabunde-style static reactor or a rotary reactor of the Torrovap TM design (Torrovap Industries, Markham, Ontario, Canada) may also be useful in certain instances, but are limited, by comparison, in the scope of their utility. A complete description of the three basic reactor designs and their use in the preparation of colloidal metal dispersions is given in U.S. patent application Ser. No. 07/125,600.

The variety of metals which can be used to prepare the stable colloidal dispersions of this invention include transition metals, noble metals and the rare earth metals and includes metalloids, for example, aluminum and antimony, and main-group metals Stable, colloidal metal dispersions can be prepared from a large number of metals selected from the elements of atomic numbers 11–106. More important metals in order of their atomic numbers are: aluminum, scandium, titanium, vanadium, chromium, manganese, iron, cobalt, nickel, copper, zinc, gallium, germanium, yttrium, zirconium, niobium, molybdenum, technetium, ruthenium, rhodium, palladium, silver, cadmium, indium, tin, antimony, lanthanum, gadolinium, hafnium, tantalum, tungsten, rhenium, osmium, iridium, platinum, gold, thallium and lead. Metals that are believed to be of particular importance, all of which are non-ferromagnetic, for purposes of this invention are: copper, gold, iridium, palladium, platinum, rhodium, silver, rhenium, ruthenium, osmium, indium, tin and lead.

Colloidal elemental metal particles of this invention may be comprised of a single metal or combinations of two or more metals. Mixed metal compositions may be produced in a number of ways, including simultaneous or sequential metal evaporation from multiple evaporation sources or evaporation of metal alloys from a single source Each of the colloidal elemental metal particles of the toner fluids of the present invention has a metal core which is more than 99 weight percent, preferably more than 99.5 weight percent pure metal. The metal core is usually crystalline, but may be amorphous depending upon the conditions used in its preparation. The elemental metal core may be surrounded by a thin surface coating of metal oxide or metal salt formed by surface oxidation of the elemental metal in air or by a component of the liquid medium. When present, the metal oxide or salt coating can account for less than 20 mo)e percent, preferably 10 mole percent, most preferably 5 mole percent, of the total metal content (metal plus metal oxide or salt). In many cases, the particles are essentially free of any oxide or metal salt coating. The extent of the oxide (or salt) layer, when present, will depend on the ease of oxidation of the particular elemental metal and the sample history (i.e., degree of air exposure). Chemically or physically adsorbed surfactant can form an extreme outer layer on the particles. Such a layer is generally associated with (i.e., chemically or physically adsorbed) the metal particles of the present invention. A layer of surfactant on the metal particles serves to charge the particles in the dispersion and may provide steric stabilization of the metal particle dispersion toward flocculation. The surfactant and oxide or salt layers may be continuous or non-continuous.

Size and distribution of the colloidal elemental metal particles is similar for all of the evaporation techniques employed; particle sizes ranging from 1 to 100 nm, but more commonly from 2 to 50 nm have been identified by electron microscopy. Most preferably, a mean particle size of 10 nm with a standard deviation of 1 to 6 nm is achieved, preferably with a standard deviation less than 4 nm, as determined by a combination of electron microscopy and photon correlation spectroscopy. The small particle size and narrow distribution provides high resolution in electrographic imaging.

Limits on the maximum metal loadings in the toner fluid dipersions are dependent upon the concentration of surfactant in the organic carrier liquid. Limitations exist due to instability of the dispersions toward particle aggregation or flocculation at high metal concentrations. At the low surfactant concentrations most commonly employed (0.01 to 1.0 g/100 ml of carrier liquid) in toner fluids of this invention, metal loadings up to 1.0% by weight in the organic carrier liquid, preferably in the range of 0.001 to 0.1% by weight, have been achieved without appreciable flocculation of the dispersion over a period of months at room temperature under ambient conditions.

Suitable organic carrier liquids useful in preparing toner fluid dispersions of this invention must fulfill the normal requirements of high volume resistivity and low dielectric constant previously established for other liquid toners used in electrophoretic development. Although firm limits have not been established, volume resistivities greater than $10^{12}$, preferably greater than $10^{13}$, and most preferably greater than $10^{14}$ ohm.cm, and dielectric constants less than 3.5, and preferably less than 2.5, are acceptable. Furthermore, it is preferred that the carrier liquid have a melting point of at most 15° C., and a boiling point between 60°–300° C. at 1 atmosphere pressure and a viscosity less than 5 centipoise at 25° C. Classes of liquid media which satisfy these criteria and which can be employed as carriers in toner fluid applications in the present invention include: straight-chain, branched-chain, and cyclo-aliphatic hydrocarbons such as petroleum oils, naphtha, ligroin, hexane, pentane, heptane, octane, isododecane, isononane and cyclohexane; aromatic hydrocarbons such as benzene, toluene and xylene; and halocarbon liquids such as 1,1,2-trichloro-1,2,2-trifluoroethane, trichloromonofluoromethane and carbon tetrachloride. Organic carrier liquids particularly useful in the preparation of the toner fluid dispersions of this invention, because of their high purity, high volume resistivity, low dielectric constant, low viscosity, and convenient boiling range are the isoparaffinic hydrocarbons Isopar ™ G (b.p.=156°-176° C) and Isopar ™ M (b.p.=207°-254° C.) (Exxon Company USA, Houston, Tex.).

Utility of the colloidal metal dispersions of this invention as toner fluids for electrophoretic development relies on the electrostatic charge associated with the suspended metal particles and the consequent mobility of the particles in an electric field. Particle charging arises from the addition of surface active agents (surfactants). According to present theory, surfactants interact chemically with dispersed metal particles, causing specific adsorption of ions a the particle surface. In toner fluid media of low dielectric constant and low ion concentration, specific ion adsorption from added surfactants is believed to be the principle charge control mechanism. In addition to providing electrophoretic mobility, the electrostatic charge on particles also stabilizes the dispersions toward flocculation through mutual electrostatic repulsion of particles of like charge. In the case of high molecular weight surfactants, surface adsorbed species may also provide steric stabilization of dispersions. Since the detailed mechanism of charge control in liquid toners is not well established and depends to a large degree on the particle surface composition, no definitive rules regarding choice of surfactant are available.

Surfactant compositions found to be effective as charge control agents in toner fluid dispersions known in the art include natural and synthetic materials and combinations thereof which can be neutral or ionic. Natural materials include triglycerides such as linseed oil and soybean oil, and fatty acids such as linoleic acid, linolenic acid, oleic acid, and their combinations. Synthetic surfactants generally provide superior toner fluid stability and performance; these include homopolymers and copolymers of vinyl-containing monomers such as: N-vinylpyrrolidone, vinylalcohol, styrene, vinyltoluene, vinylpyridine, acrylates (i.e. methylmethacrylate); block, graft or random copolymers such as those comprised of the following monomer combinations: styrene-butadiene, vinylchloride-vinyl ether, methacrylic acid ester-N-vinylpyrrolidone, fatty acid-methacrylate ester, styrene-allyl alcohol and alkylacrylate-styrene-butadiene; polyesters of carboxylic acids (i.e. polydecamethylene sebacate, alkyd resins); epoxy resins and phenolic resins (i.e. Novolaks); functionally terminated homopolymers such as: epoxide or amine-terminated polyolefins; ionic surfactants such as: copper oleate, Aerosol ™ TO (sodium dioctylsulfosuccinate), triisoamylammonium picrate and aluminum octoate and mixtures or combinations thereof. Other commercially available charge control agents useful in the art are given in R. M. Shaffert, "Electrophotography" (supra), pages 71, 72.

Specific surfactants found to be useful in producing toner fluid dispersions of the present invention include epoxide terminated polyisobutylenes: Actipol ™ E6, E16, and E23 (Amoco Chemical Co., Chicago, Ill.); commercial oil additives: Lubrizol ™ 6401 and Lubrizol ™ 6418 (The Lubrizol Corporation, Wickliffe, Ohio), AMOCO ™ 9250 (AMOCO Petroleum Additives Company, Naperville, Ill.), and OLOA ™ 1200 (Chevron Chemical Company, San Francisco, Calif.); and hydrocarbon compatible hyperdispersants such as Solsperse ™ 17,000 (ICI Americas Inc., Wilmington, Del.). OLOA 1200, a low molecular weight polyisobutylene attached to a diamine head group by a succinimide linkage, is the preferred surfactant because of the stability and performance it imparts to the resulting toner fluids.

Concentration of surfactant used in preparing colloidal metal dispersions can have a dramatic influence on toner fluid performance. Surfactant concentration levels that are too low result in inadequate stability toward flocculation, whereas excess surfactant can lead to high ion concentrations in the medium which reduce the speed and efficiency of the development process In general, surfactant concentrations between 0.001 and 10.0 g/100 mL based on the total fluid, but preferably between 0.01 and 1.0 g/100 mL, can be used to prepare toner fluid dispersions of this invention. With the surfactant OLOA 1200, concentrations between 0.01 and 0.12 g/100 ml in Isopar M or G produced toner fluids; optimum developing speed and efficiency were attained at a level of 0.04 g/100 ml.

In another aspect of this invention, methods are provided for electrophoretically depositing the colloidal metal particles of the toner fluid on a dielectric or photoconductive substrate to produce uniform, nonconductive, metallic coatings on a substrate surface in the form of continuous films or patterned images. In the present invention, it was convenient to use substrates in the form of thin, 2-dimensional, planar sheet constructions, although alternative substrate constructions are possible. Suitable dielectric substrates include virtually any nonconductive organic or inorganic solid, particularly polymeric and ceramic materials readily fabricated into thin films or other appropriate constructions. Suitable photoconductive films may be of the organic or inorganic type, such as those described by R. M. Schaffert in "Electrophotography" The Focal Press, New York, 1975, pp. 60–69, 260–396.

Examples of useful substrate compositions include dielectric polymers such as: Kapton ™ polyimide (duPont de Nemours & Co. Inc., Wilmington, Del.), polypropylene and polyethylene terephthalate (PET); inorganic dielectric materials such as aluminum oxide and silica-based glasses; and photoconductive film constructions such as: Kodak Ektavolt ™ Recording Film SO-102 (Eastman Kodak Co., Rochester, N.Y.) and bis-5,5,-(N-ethylbenzo[a]carbazolyl)-phenyl methane (BBCPM) based photoconductive films described in U.S. Pat. Nos. 4,337,305 and 4,356,244. One may use a wide range of alternative dielectric and photoconductive materials as the substrates in the present invention.

Electrophoretic deposition is achieved using known electrographic coating and imaging techniques. These generally involve first sensitizing or charging the substrate surface by, for example, deposition of positive or negative ions generated in a corona discharge, followed by development of charged areas of substrate via the electrostatic attraction of the oppositely charged particles of the toner fluid. Alternatively, an external electric field may be applied to drive charged toner particles to the substrate surface. A number of variations on these basic processes are known in the art, but all basically rely on mobility of electrostatically charged toner particles in an electric field to achieve controlled deposition of particles on the substrate surface. Coatings thus produced may be in the form of continuous films covering the entire substrate surface or patterned images. Patterned images are produced by selective charging of the substrate surface to form a latent electrostatic image followed by selective electrophoretic development of only the charged or uncharged areas.

For the purpose of this invention, standard electrophotographic equipment was used for producing colloidal metal coatings and patterned images on a variety of substrates. A particularly useful electrophotographic set-up consisted of the following components: (1) a corona-discharge unit for depositing charge on the substrate surface, (2) a projection exposure unit for generating a latent electrostatic image on a photoconductive substrate, and (3) an extrusion-type developing station for contacting the charged substrate with toner fluid of the invention and providing controlled colloidal metal deposition on the substrate surface through application of a potential bias. Representative methods of producing colloidal metal coatings or patterned images using this equipment are included in the examples which follow.

Density of colloidal metal particles in the coatings produced via electrophoretic deposition depends on a number of parameters including substrate film thickness, corona-charging potential, bias voltage applied to the developing station, and development time. In the case of transparent substrates, relative metal loadings in the coated areas were estimated from measured optical densities. For a fixed surface potential, metal loadings decreased with increasing substrate film thickness, thus limiting the practical scope of the process to dielectric or photoconductive substrates in which the dielectric or photoconductive layer is less than approximately 1270 micrometers (50 mil) thick and preferably less than 255 micrometers (10 mil) thick. At the highest metal loadings generated on ultrathin (6 micrometer) polyester film, colloidal metal coatings were still nonconductive according to two-probe resistance measurements indicating an absence of extended contacts between metallic particles.

In one of the preferred embodiments of this invention, colloidal metal particles were electrophoretically deposited on a BBCPM based photoconductive film construction described in U.S. Pat. No. 4,337,305, Example 26, in the form of high resolution, nonconductive, metallic images. High resolution imaging was achieved by first charging the entire surface of the photoconductor in a corona discharge and then selectively discharging the surface by exposure to a projected image of a high resolution target to form a latent electrostatic image. Development of the latent image under a controlled bias potential using the metallic toner fluid dispersion of the invention produced the corresponding colloidal metal image. Nonconductive, metallic images with a resolution up to 240 line-pairs/mm or individual line widths of equal to or greater than 2.0 micrometers have been obtained. Based on the average size of the colloidal metal particles (about 10 nm), resolution in the submicrometer range is expected to be feasible with more sophisticated electrophotographic equipment.

In yet another aspect of this invention, methods are provided for enhancing the electrophoretically deposited, nonconductive, colloidal metal coatings and images via electroless metal plating. In this process, immobilized colloidal metal particles function as catalysts for promoting electroless metal plating. Thus, electroless metal plating occurs selectively in those areas on the substrate surface where colloidal metal has been deposited. Enhanced coatings and images become completely metallized in the electroless plating process and exhibit excellent electrical conductivity. Furthermore, even at resolutions up to 150 line-pairs/mm, image enhancement and electrical conductivity is achieved with negligible resolution loss.

Colloidal metals known to be useful as catalysts for electroless plating include metals from Periodic Table Groups 8–11. Particularly useful in terms of their catalytic activity are the metals Cu, Ni, Ag, Au, Pt, and Pd. From the standpoint of a desirable combination of cost, stability (toward oxidation or flocculation), and catalytic activity, colloidal Pd appears to be the metal of choice in this application.

Electroless plating solutions useful in this process have been described in the prior art. These minimally consist of a solution of a metal salt and a reducing agent in aqueous or organic media. In an electroless plating process the metal in the metal salt is catalytically reduced to its elemental form and deposited as such. Salts of a variety of metals have been shown to be effective for this purpose. Particularly useful are aqueous electroless plating solutions of copper, nickel, and cobalt which are readily prepared or are available from a variety of commercial sources and are described in "Plating of Plastics with Metals" by J. McDermott, Noyes Data Corporation, Park Ridge, N.J., pp. 62, 94, 177 (1974).

Metallic toner fluid dispersions of the present invention can be used to prepare articles coated in a continuous or imagewise fashion with colloidal metal. Colloidal metal coatings appear continuous to the eye but when viewed with an electron microscope, discrete metal particles can be seen. Articles bearing the nonconductive, colloidal metal coatings can find applications in areas of catalysis (i.e. electroless plating), optical or magnetic recording and biomedical science. Electroless plated articles in which the original colloidal metal coating has been enhanced and made electrically conductive can find applications in the electronics area as printed circuits or microcircuits or materials for antistatic control. Other applications in the graphics reproduction area for producing metallized graphics or in optical devices for absorbing, reflecting or otherwise modulating various types of radiation are also forseen.

Objects, features and advantages of this invention are further illustrated by the following examples, but the particular examples and amounts thereof recited in these examples, as well as other conditions and details, should not be construed to unduly limit this invention. All organic carrier liquids in the Examples had volume resistivities qreater than $10^{14}$ ohm.cm and dielectric constants less than 2.5.

EXAMPLE 1

This example describes a typical procedure for preparation of a colloidal metal dispersion in a nonconductive organic liquid medium of low dielectric constant containing a dissolved surfactant for application as a liquid toner in electrophoretic coating and imaging. Preparation of the dispersion was accomplished by metal evaporation and transfer into the liquid medium using a Gas Evaporation Reactor (GER).

In a GER reactor equipped with a direct drive mechanical vacuum pump, gold metal was evaporated from a resistively heated, alumina coated, tungsten crucible into a stream of $N_2$; gas with a flow rate adjusted such that the internal reactor pressure was maintained at 10.0 torr. As the gold vapor was carried away from the crucible in the gas stream, metal clustering occurred to form colloidal gold particles. The stream of gold particles was bubbled through a solution containing 0.022 wt % OLOA 1200 surfactant in Isopar M at −40° C. Gold particles captured by the solution formed a dark purple, transparent dispersion containing 0.024% gold by weight. The colloidal dispersion appeared to be indefinitely stable under ambient conditions with no noticeable settling or flocculation over a period of months. Analysis of the dispersion by photon correlation spectroscopy revealed a mean number average gold particle size of 10.0 nm with a standard deviation of 3.8 nm. Presence of colloidal gold was confirmed by transmission electron microscopy which showed highly crystalline particles with a primary particle size ranging from 4–21 nm. Conductivity of the final liquid dispersion was measured at $0.8 \times 10^{-11}$ $(ohm.cm)^{-1}$ Electrophoresis measurements indicated that the suspended gold particles were negatively charged with a zeta potential of −230 mV (±20%).

EXAMPLES 2-12*

The following samples were prepared by the method of Example 1 except that argon rather than nitrogen was used as the inert gas stream:

| Example Number | Colloidal Metal | weight percent | Surfactant | weight percent |
|---|---|---|---|---|
| 2 | Au | 0.0183 | OLOA 1200 | 0.02 |
| 3 | Pd | 0.0201 | OLOA 1200 | 0.04 |
| 4 | Ni | 0.0039 | OLOA 1200 | 0.04 |
| 5 | Pt | 0.0012 | OLOA 1200 | 0.04 |
| 6 | Cr | <0.0100 | OLOA 1200 | 0.03 |
| 7 | Cu | <0.0100 | OLOA 1200 | 0.04 |
| 8 | Pd | <0.0100 | AMOCO 9250 | 4.0 |
| 9 | Pd | <0.0500 | LUBRIZOL 6418 | 0.03 |
| 10 | Pd | <0.0500 | LUBRIZOL 6401 | 0.03 |
| 11 | Ag | <0.0100 | AMOCO 9250 | 2.0 |
| 12 | Pd | 0.0052 | Actipol E6 | 0.5 |

*Average metal particle size determined by transmission electron microscopy and/or photon correlation spectroscopy ranged from 5 to 15 nm; carrier liquid was Isopar G.

EXAMPLE 13

This example describes a typical procedure for electrophoretic deposition of continuous colloidal metal coatings on a dielectric film substrate by application of an external electric field.

A 6 micrometer thick film of polyethylene terephthalate (PET, E. I. duPont de Nemours & Co., Inc., Wilmington, Del.) was adhered to a grounded aluminum plate by application of a thin layer of ethanol at the film-aluminum interface. The entire assembly was passed throuqh an extrusion type developing station commonly used in liquid toner development using a colloidal gold dispersion in Isopar M (prepared as in Example 1) as the toner fluid. With the PET film in contact with the meniscus of the colloidal gold dispersion, a negative potential of 300 V was applied to the developing station such that the negatively charged gold particles were repelled and driven to the surface of the polymer film. A continuous colloidal elemental metal coating the width of the developing station was produced. PET surface potential after development was measured at −80 V with respect to the grounded plate. Increasing the developing voltage or the development time produced an increase in surface potential of the coated film and a more dense colloidal metal coating on the PET surface. However, even at the highest metal loadings, no electrical conductivity could be detected by two probe resistance measurements.

EXAMPLE 14

This example describes a typical procedure for electrophoretic deposition of continuous colloidal metal coatings on a dielectic film substrate by charging the substrate surface in a corona discharge.

A 6 micrometer thick film of PET was adhered to a grounded aluminum plate as in the previous example. The entire assembly was passed through a (+) DC corona discharge device in order to deposit a positive charge on the PET surface with an initial surface potential of 100 to 1000 V. Electrophoretic deposition of colloidal gold or palladium coatings was accomplished by contacting the charged surface with Isopar G dispersions of Examples 2 or 3, by passing the film assembly through the extrusion developing station at zero bias potential. This technique produced continuous colloidal metal surface coatings on the PET surface. Density of the colloidal metal coatings increased with increasing initial positive surface potential; however, none of the coatings exhibited measurable electrical conductivity.

EXAMPLE 15

This example describes a procedure for image-wise electrophoretic deposition of colloidal metal patterns on a dielectric film substrate at low resolution.

As in the previous example, a 6 micrometer thick film of PET was adhered to a grounded aluminum plate. A high resolution, metallic, Air Force target with patterned cutouts was placed on top of the PET to mask the surface. The entire assembly was passed through a (+) 6000 volt DC corona discharge to deposit a latent positive charge pattern on the PET surface. After removing the metal mask, the charge pattern was developed by exposure to a colloidal gold dispersion in Isopar M (toner fluid prepared as in Example 1) either by spraying with toner fluid or passing through the extrusion type developing station as previously described. Selective deposition of negatively charged gold particles on the positively charged pattern produced a nonconductive colloidal metal image. Maximum resolution was 4 lines/mm, the limit of the metal target.

EXAMPLE 16

This example describes a procedure for production of high resolution colloidal metal images on a photoconductive substrate using standard electrophotographic techniques.

A film of BBCPM based organic photoconductor (prepared as in U.S. Pat. No. 4,337,305, Example 26) was adhered to a grounded aluminum plate and the surface of the photoconductor was charged with an initial surface potential of (+)700 V by passage under a corona discharge. Selective photodischarge to produce a latent positive charge pattern was accomplished by projecting a 24X reduced image of a high resolution target on the charged photoconductor surface using a projection exposure unit. The latent charge pattern was developed by contacting with a colloidal gold dispersion in Isopar G containing 0.022 wt % OLOA 1200 (prepared as in Example 2) using the extrusion developing station. Resolution of the final metallic images depended on the applied developing bias potential and varied from 150 line-pair/mm at 0 volts to 240 line-pair/mm at +200 volts. Further increase in the developing bias potential did not increase resolution, but decreased the optical density of the images. Metallic images were purple to grey and exhibited negligible conductivity according to 2-probe measurements.

EXAMPLES 17 and 18

These examples describe use of electrophoretically deposited metal colloids on dielectric or photoconductive substrate surfaces as immobilized catalysts for promoting selective electroless metal deposition and the production of electrically conductive metallic coatings and patterned images.

17. Continuous Electroless Plating of Alumina Plate

A colloidal gold coating was deposited from an Isopar G dispersion (containing 0.022 wt % OLOA 1200 prepared as in Example 2) onto the surface of a 635 micrometer (25 mil) thick fused alumina plate according to the procedure described in Example 13. Bias potentials up to −5000 volts were used. The gold coating was metallic grey in appearance and nonconductive. Immersion of the plate in a commercial electroless copper plating solution, CUPOSIT ™ 328 (Shipley Company Inc., Newton, Mass.), at room temperature for 20 minutes produced a metallic copper film on the colloidal gold-coated surface. No copper deposition occured on the gold-free surfaces. A 2-probe resistance of approximately 10.0 ohms indicated that the copper coating was electrically conductive. 18.

18. High Resolution, Image-Wise Electroless Plating of Photoconductive Film

Colloidal gold line patterns with a maximum resolution of 150 line-pair/mm were produced on a film of BBCPM photoconductor using the procedure described in Example 16. The initial images exhibited no measurable electrical conductivity. Immersion of the imaged film in a CUPOSIT 328 electroless plating solution for 20 minutes at room temperature resulted in selective copper plating in the colloidal metal coated areas. The final copper images displayed enhanced electrical conductivity (2 probe resistance=approximately 10 ohms) with no loss of resolution.

Various modifications and alterations of this invention will become apparent to those skilled in the art without departing from the scope and spirit of this invention, and it should be understood that this invention is not to be unduly limited to the illustrative embodiments set forth herein.

We claim:

1. A toner fluid dispersion comprising electrostatically charged, colloidal elemental non-ferromagnetic metal particles dispersed in an electrically nonconductive organic carrier liquid of dielectric constant less than 3.5 and having a volume resistivity greater than $10^{12}$ ohm.cm, and an amount of a soluble surfactant effective to charge and stabilize said dispersion, said metal particles having sizes in the range of 1 to 100 nm.

2. The toner fluid according to claim 1 wherein said metal particles are selected from the group of non-ferromagnetic metals having atomic numbers in the range of 11 to 106.

3. The toner fluid according to claim 1 wherein said metals are selected from the group consisting of aluminum, scandium, titanium, vanadium, chromium, manganese, copper, zinc, gallium, germanium, yttrium, zirconium, niobium, molybdenum, technetium, ruthenium, rhodium, palladium, silver, cadmium, indium, tin, antimony, lanthanum, hafnium, tantalum, tungsten, rhenium, osmium, iridium, platinum, gold, thallium and lead.

4. The toner fluid according to claim 1 wherein said metals are selected from the group consisting of copper, gold, iridium, manganese, palladium, platinum, rhodium, silver, rhenium, ruthenium, osmium, chromium, molybdenum, tungsten, indium, tin and lead.

5. The toner fluid according to claim 1 wherein said metal is selected from the group consisting of copper, gold, iridium, manganese, palladium, platinum, rhodium, silver, rhenium, ruthenium, osmium, chromium, molybdenum, tungsten, indium, tin, and lead.

6. The toner fluid according to claim 1 wherein said metal is selected from the group consisting of gold, silver, copper, platinum, palladium, iridium, rhodium, rhenium, ruthenium, and osmium.

7. The toner fluid according to claim 1 wherein said metals are selected from the group consisting of gold, palladium, platinum, silver, and copper.

8. The toner fluid according to claim 1 wherein said metal particles have sizes in the range of 2 to 50 nm.

9. The toner fluid according to claim 1 wherein said metal particles are present in the range of 0.001 to 1.0 percent by weight in the carrier liquid.

10. The toner fluid according to claim 9 wherein said metal particles are present in the range of 0.001 to 0.1 percent by weight.

11. The toner fluid according to claim 1 wherein said carrier liquid is selected from the group consisting of aliphatic and aromatic hydrocarbons and halocarbons.

12. The toner fluid according to claim 1 wherein said surfactant is selected from the group consisting of natural and synthetic surfactants and combinations thereof.

13. The toner fluid according to claim 1 wherein said surfactant is present in the range of 0.001 to 10.0 g/100 mL of carrier liquid.

14. The toner fluid according to claim 1 wherein said metal particles comprise a continuous or discontinuous layer of oxide on a metal core.

15. The toner fluid according to claim 1 wherein said metal particles further comprise a continuous or discontinuous outer layer of said surfactant chemically or physically adsorbed thereon.

16. The toner fluid according to claim 14 wherein said particles further comprise a continuous or discontinuous outer layer of surfactant chemically or physically adsorbed thereon.

17. The toner fluid according to claim 13 wherein said surfactant is present in the range of 0.01 to 1.0 g/100 mL of carrier liquid.

18. A method comprising the steps:
(a) providing the toner fluid dispersion according to claim 1, and providing a dielectric or photoconductive substrate,
(b) electrophoretically and irreversibly depositing the charged, colloidal, elemental metal particles of the toner fluid in a continuous or imagewise fashion on at least one of the surfaces of said substrate using standard electrographic techniques to provide a nonconductive, colloidal, elemental metal coating thereon, and
(c) optionally, in the case of a catalytically active colloidal, elemental metal, subjecting the resulting colloidal metal coated substrate to an electroless metal plating solution to induce selective metal plating on the elemental colloidal metal coated portions of the substrate surface, to provide a second elemental metallic coating on said portions of the substrate surface which is electrically conductive.

19. A catalytic article prepared according to the method of claim 18, steps (a) and (b).

20. A catalytic circuit prepared according to the method of claim 18, steps (a), (b), and (c).

21. A method comprising the steps:
(a) providing a toner fluid dispersion comprising electrostatically charged, colloidal, elemental metal particles dispersed in an electrically nonconductive organic carrier liquid of dielectric constant less than 3.5 and having a volume resistivity greater than $10^{12}$ ohm.cm, and providing a dielectric or photoconductive substrate,
(b) electrophoretically and irreversibly depositing the charged, colloidal, elemental metal particles of the toner fluid in a continuous or imagewise fashion on at least one of the surfaces of said substrate using standard electrographic techniques to provide a nonconductive, colloidal, elemental metal coating thereon, and
(c) optionally, in the case of a catalytically active colloidal, elemental metal, subjecting the resulting colloidal metal coated substrate to an electroless metal plating solution to induce selective metal plating on the elemental colloidal metal coated portions of the substrate surface, to provide a second elemental metallic coating on said portions of the substrate surface which is electrically conductive.

22. A catalytic article prepared according to the method of claim 21, steps (a) and (b).

23. A printed circuit prepared according to the method of claim 21, steps (a), (b), and (c).

* * * * *

UNITED STATES PATENT AND TRADEMARK OFFICE
CERTIFICATE OF CORRECTION

PATENT NO. : 4,892,798  
DATED : January 9, 1990  
INVENTOR(S) : William M. Lamanna et al.

It is certified that error appears in the above-identified patent and that said Letters Patent is hereby corrected as shown below:

```
Col. 1, line 32, after "between" insert -- a --.
Col. 1, line 57, delete "(1974)" and insert
-- (1975) --.
Col. 5, line 38, after "metals" insert -- . --.
Col. 5, line 60, after "source" insert -- . --.
Col. 6, line 3, "mo)e" should read -- mole --.
Col. 6, line 33, "dipersions" should read
-- dispersions --.
Col. 7, line 15, "a" should read -- at --.
Col. 7, line 52, "TO" should read -- OT --.
Col. 8, line 12, after "process" insert -- . --.
Col. 8, line 45, "bis-5,5,-" should read
-- bis-5,5'- --.
```

UNITED STATES PATENT AND TRADEMARK OFFICE
CERTIFICATE OF CORRECTION

PATENT NO. : 4,892,798
DATED : January 9, 1990
INVENTOR(S) : William M. Lamanna et al.

It is certified that error appears in the above-identified patent and that said Letters Patent is hereby corrected as shown below:

Col. 10, line 48, "qreater" should read -- greater --.

Col. 10, line 63, delete ";".

Col. 11, line 14, after ")$^{-1}$" insert -- . --

Col. 13, line 27, delete "18.".

Signed and Sealed this

Twenty-first Day of September, 1993

Attest:

BRUCE LEHMAN

Attesting Officer

Commissioner of Patents and Trademarks